United States Patent
Kim et al.

(10) Patent No.: US 9,329,544 B2
(45) Date of Patent: May 3, 2016

(54) POLYMER-BASED LONG LIFE FUSERS AND THEIR METHODS OF MAKING

(75) Inventors: Woo Soo Kim, Oakville (CA); Yu Qi, Oakville (CA); Nan-Xing Hu, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 687 days.

(21) Appl. No.: 12/692,955

(22) Filed: Jan. 25, 2010

(65) Prior Publication Data
US 2011/0183265 A1 Jul. 28, 2011

(51) Int. Cl.
*B05D 3/12* (2006.01)
*G03G 15/20* (2006.01)
*G03F 7/00* (2006.01)
*B82Y 10/00* (2011.01)
*B82Y 40/00* (2011.01)

(52) U.S. Cl.
CPC ............ *G03G 15/2057* (2013.01); *B82Y 10/00* (2013.01); *B82Y 40/00* (2013.01); *G03F 7/0002* (2013.01)

(58) Field of Classification Search
USPC ........................................................ 427/355
See application file for complete search history.

(56) References Cited

U.S. PATENT DOCUMENTS

| | | | |
|---|---|---|---|
| 4,842,944 A | 6/1989 | Kuge et al. | |
| 5,187,849 A | 2/1993 | Kobayashi | |
| 5,204,156 A | 4/1993 | Lumb et al. | |
| 5,485,259 A | 1/1996 | Uehara et al. | |
| 5,547,759 A * | 8/1996 | Chen et al. | 428/421 |
| 5,649,273 A | 7/1997 | Shimizu et al. | |
| 5,788,770 A | 8/1998 | Hobson et al. | |
| 5,846,643 A | 12/1998 | Badesha et al. | |
| 6,099,673 A | 8/2000 | Van Bennekom | |
| 6,143,675 A | 11/2000 | McCollam et al. | |
| 6,295,434 B1 | 9/2001 | Chang et al. | |
| 6,375,870 B1 * | 4/2002 | Visovsky et al. | 264/1.31 |
| 6,514,650 B1 | 2/2003 | Schlueter, Jr. et al. | |
| 6,664,336 B1 * | 12/2003 | Tomihashi et al. | 525/199 |
| 6,668,152 B1 | 12/2003 | Jacob | |
| 6,927,006 B2 * | 8/2005 | Finn et al. | 430/124.35 |
| 7,441,745 B2 * | 10/2008 | Kawaguchi et al. | 249/114.1 |
| 2002/0084553 A1 * | 7/2002 | Nun et al. | 264/284 |
| 2002/0150723 A1 | 10/2002 | Oles et al. | |
| 2002/0197553 A1 | 12/2002 | Pickering et al. | |
| 2003/0054155 A1 | 3/2003 | Nomi et al. | |

(Continued)

FOREIGN PATENT DOCUMENTS

CN 1892501 A 1/2007
EP 1580514 A1 9/2008

(Continued)

OTHER PUBLICATIONS

Author Unknown, PTFE Porous Membranes Product Specification, available at http://3dsro.sk/datasheet/classicfilters/051-Membranes.pdf, 2014, 1 page.

(Continued)

*Primary Examiner* — Nathan Empie
(74) *Attorney, Agent, or Firm* — MH2 Technology Law Group LLP

(57) ABSTRACT

Exemplary embodiments provide materials and methods for polymer-based fixing members that have a textured surface with reduced surface energy and increased surface hydrophobicity.

19 Claims, 6 Drawing Sheets

(56) References Cited

U.S. PATENT DOCUMENTS

| | | | |
|---|---|---|---|
| 2005/0267260 A1* | 12/2005 | Frances | C08L 27/12 525/178 |
| 2006/0018026 A1* | 1/2006 | Bastawros et al. | 359/619 |
| 2006/0156475 A1 | 7/2006 | Oles et al. | |
| 2006/0292360 A1 | 12/2006 | Hays et al. | |
| 2007/0031639 A1* | 2/2007 | Hsu et al. | 428/141 |
| 2007/0120095 A1 | 5/2007 | Gruner | |
| 2007/0292660 A1 | 12/2007 | Kikukawa | |
| 2008/0152896 A1 | 6/2008 | Moorlag et al. | |
| 2008/0306202 A1 | 12/2008 | Lin et al. | |
| 2009/0016790 A1* | 1/2009 | Funabiki | 399/329 |
| 2009/0123185 A1 | 5/2009 | Lin et al. | |
| 2009/0324308 A1* | 12/2009 | Law et al. | 399/333 |
| 2010/0055450 A1 | 3/2010 | Qi et al. | |
| 2010/0137499 A1 | 6/2010 | Moorlag et al. | |
| 2010/0183864 A1 | 7/2010 | Qi et al. | |
| 2010/0184346 A1 | 7/2010 | Qi et al. | |
| 2011/0183114 A1 | 7/2011 | Kim et al. | |

FOREIGN PATENT DOCUMENTS

| | | | | |
|---|---|---|---|---|
| JP | S629377 | A | | 1/1987 |
| JP | H0380277 | A | | 4/1991 |
| JP | 06186881 | A | | 7/1994 |
| JP | H07191567 | A | | 7/1995 |
| JP | 11194640 | A | * | 7/1999 |
| JP | 2004294049 | A | | 10/2004 |
| JP | 2005132919 | A | | 5/2005 |
| JP | 2005144751 | A | | 6/2005 |
| JP | 2006126595 | A | | 5/2006 |
| JP | 2007304374 | A | | 11/2007 |
| JP | 2008156646 | A | | 7/2008 |
| WO | 2004097853 | A1 | | 11/2004 |
| WO | 2007001405 | A2 | | 1/2007 |
| WO | 2007024206 | A2 | | 3/2007 |
| WO | 2008046166 | A2 | | 4/2008 |
| WO | 2008085550 | A2 | | 7/2008 |

OTHER PUBLICATIONS

Kenneth K.S. Lau et al, "Superhydrophobic Carbon Nanotube Forests", Nano Letters, vol. 3, No. 12, Oct. 22, 2003, pp. 1701-1705.
Extended European Search Report dated Apr. 9, 2010, European Application No. 10150822.4 filed Jan. 15, 2010, pp. 1-9.
Ken-Ichi Tanuma, Summary of Japanese Office Action dated Mar. 25, 2014, Japanese Application No. 2010-009012 filed Jan. 19, 2010, pp. 1-3.
Extended European Search Report dated Mar. 31, 2010, European Application No. 10151211.9 filed Jan. 20, 2010, pp. 1-3.
First Office Action dated Apr. 17, 2013, Chinese Patent Application No. 201010001677.9 filed Jan. 21, 2010, pp. 1-13.
First Office Action dated Jun. 13, 2013, Canadian Patent Application No. 2,690,225 filed Jan. 14, 2010, pp. 1-3.
Toshihiro Tanimura, Summary of Japanese Office Action dated Jan. 28, 2014, Japanese Application No. 2010-009013 filed Jan. 19, 2010, pp. 1-4.
Matthew D. Fagan, "A Novel Process for Continuous Thermal Embossing of Large-Area Nanopatterns onto Polymer Films", University of Massachusetts—Amherst, Masters Thesis 1896, Feb. 2014, pp. 1-75.
Author Unknown, heat embossing, Definition, BusinessDictionary. com, http://www.businessdictionary.com/definition/heat-embossing.html, accessed Nov. 21, 2014, 1 page.
Author Unknown, Hot Embossing, http://www.mems-exchange.org/catalog/hot_embossing/, accessed Nov. 21, 2014, 1 page.

* cited by examiner

POLYMER-BASED LONG LIFE FUSERS AND THEIR METHODS OF MAKING

FIELD OF USE

The present teachings relate generally to fixing members used for electrophotographic devices and, more particularly, to polymer-based fixing members having a textured surface with a low surface energy.

BACKGROUND

Polymeric materials such as fluoropolymers, including fluoroelastomers and fluoroplastics, are used as topcoats for fusers of electrophotographic devices. These topcoat materials provide low surface energy and/or high chemical resistance, as well as thermal stability useful for toner releasing in fusing operations. Because fusers are constantly engaged with paper and toner, conventional topcoat materials are prone to damage, which limits the fuser service life.

Aromatic polyimides are known as tough polymers due to their mechanical strength, abrasion resistance, chemical resistance and thermal stability. These are desirable properties for fuser topcoats. However, polyimides also have high surface energy, which is undesirable for fuser topcoats.

Thus, there is a need to overcome these and other problems of the prior art and to provide polymer-based materials, structures and/or fixing members with low surface energy.

SUMMARY

According to various embodiments, the present teachings include a method for making a fixing member. The fixing member can be made by applying a surface layer to a substrate. The surface layer can include a fluoro-polymer and a support polymer, while the substrate can include a fixing member substrate. The surface layer can then be patterned and annealed to form a plurality of structural features to provide a textured surface. The textured surface of the surface layer can include at least the fluoro-polymer.

According to various embodiments, the present teachings also include a method for making a fixing member. The fixing member can be made by applying a support polymer to a fixing member substrate using a stamp that has one or more structural features. A fluoro-polymer dispersion can then be prepared and applied onto the one or more structural features of the stamp. The fluoro-polymer dispersion on the stamp can further be transferred onto the support polymer by applying the stamp to the support polymer to imprint the one or more structural features into a surface of the support polymer. In embodiments, the support polymer can then be thermally annealed.

According to various embodiments, the present teachings further include a method for making a fixing member. In this method, a support polymer that includes polyimide can be applied to a fixing member substrate. A plurality of structural features can then be formed on a surface of the support polymer by pressing a stamp there-into, followed by applying a fluoro-polymer dispersion onto the formed one or more surface structural features. The support polymer can then be thermally annealed at a temperature ranging from about 150° C. to about 400° C.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

Figure 1A:
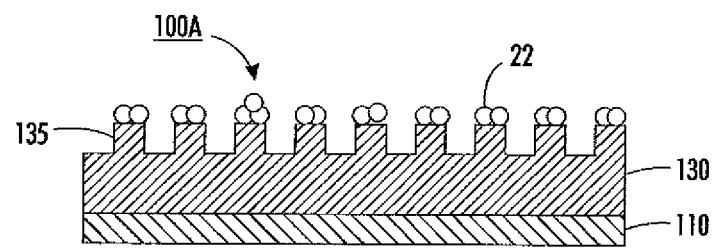
FIGS. 1A-1C depict a portion of exemplary fixing members in accordance with various embodiments of the present teachings.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide materials and methods for polymer-based materials and related fixing members used for electrophotographic devices. The fixing members can include a surface layer disposed over a substrate. The surface layer can include a fluoro-polymer incorporated with a support layer. The surface layer can further include a plurality of structural features to render the layer a textured surface, which includes at least the fluoro-polymer.

In some embodiments, fluoro-polymers can be dispersed within or embedded in the structural features of the support polymer or the entire support polymer. In other embodiments, the fluoro-polymers can be dispersed on a surface of the support polymer to form the textured surface. In still other embodiments, the fluoro-polymer incorporated with (e.g., dispersed within or on) the support polymer can be thermally annealed to form annealed surface structural features or having an annealed textured surface.

As used herein and unless otherwise specified, the term "fixing member" encompasses all possible members useful for a printing process or in a printer including, but not limited to, a fuser member, a pressure member, a heat member, and/or a donor member. In various embodiments, the "fixing member" can be in a form of, for example, a roller, a cylinder, a belt, a plate, a film, a sheet, a drum, a drelt (cross between a belt and a drum), or other known forms for a fixing member.

As used herein and unless otherwise specified, the term "fluoro-polymer" refers to any polymer that contains fluorine atom. In embodiments, the fluorine content can be at least about 80%, or at least about 50%, or at least about 30% by weight of the total fluoro-polymer.

Examples of fluoro-polymers can include polytetrafluoroethylene (PTFE, e.g., by DuPont under the tradename Teflon), perfluoroalkoxy polymer resin (PFA, e.g., by DuPont under the tradename Teflon), fluorinated ethylene-propylene, (FEP, e.g., by DuPont under the tradename Teflon), polyethylenetetrafluoroethylene (PETFE, e.g., by DuPont under the registered tradename Tefzel, or by Asahi Glass company under the registered tradename Fluon), polyvinylfluoride (PVF, e.g., by DuPont under the registered tradename Tedlar), polyethylenechlorotrifluoroethylene (PECTFE, e.g., by Solvay Solexis under the registered tradename Halar), polyvinylidene fluoride (PVDF, e.g., by Arkema under the registered tradename of Kynar), copolymers of tetrafluoroethylene (TFE) and perfluoro(ethyl vinyl ether) (PEVE), copolymers of tetrafluoroethylene (TFE) and perfluoro(methyl vinyl ether) (PMVE), copolymers of hexafluoropropylene (HFP) and vinylidene fluoride (VDF or VF2), terpolymers of tetrafluoroethylene (TFE), vinylidene fluoride (VDF) and hexafluoropropylene (HFP), and tetrapolymers of TFE, VF2, and HFP.

In embodiments, the fluoro-polymer can be in a form of, for example, a particle, a shaft, a pillar, a wire, a tube, a rod, a needle, a fiber, a thread, a flake, a coating layer and a combination thereof.

In embodiments, the fluoro-polymer can be dispersed within or embedded in the support polymer in an amount of at least about 0.5%, or at least about 5% including from about 5% to about 50% by weight of the support polymer.

In embodiments, when the fluoro-polymer is in a form of a particle, the fluoro-polymer particle can have at least one dimension of at least about 1 nm, or at least about 10 nm, or ranging from about 10 nm to about 10 µm.

In embodiments, the fluoro-polymer can have an elongated structure having a diameter of at least about 1 nm, or at least about 10 nm, or ranging from about 10 nm to about 1 µm. In embodiments, the elongated fluoro-polymer can have an aspect ratio of at least about 1, or at least about 10, or ranging from about 100 to about 10000.

In embodiments, the fluoro-polymer can be disposed on a surface of the support polymer at least partially covering the structural features of the support polymer. In this case, the fluoro-polymer can have a surface density of at least about $10^{-6}$ g/cm$^2$ on the textured surface of the underlying support polymer. In some embodiments, such surface density can range from about $10^{-6}$ g/cm$^2$ to about $10^3$ g/cm$^2$, or from about $10^{-6}$ g/cm$^2$ to about $10^{-3}$ g/cm$^2$.

In embodiments, the support polymer can be formed of one or more polymers including, but not limited to, polyimide, polycarbonate, polyesters, polyamides, polyamide-imides, polyketone, perfluoroalkoxy polymer resin (PFA), polyethylenetetrafluoroethylene (PETFE), copolymers of tetrafluoroethylene (TFE) and perfluoro(ethyl vinyl ether) (PEVE), copolymers of tetrafluoroethylene (TFE) and perfluoro(methyl vinyl ether) (PMVE), copolymers of hexafluoropropylene (HFP) and vinylidene fluoride (VDF or VF2), terpolymers of tetrafluoroethylene (TFE), vinylidene fluoride (VDF) and hexafluoropropylene (HFP), and tetrapolymers of TFE, VF2, and HFP.

For example, polyimide materials can be used as the disclosed support polymer. In embodiments, polyimide materials used can possess a number average molecular weight of, for example, from about 5,000 to about 500,000, and in an additional example, from about 10,000 to about 100,000 or from about 15,000 to about 200,000. Alternatively, the polyimide can possess a weight average molecular weight of, for example, from about 50,000 to about 5,000,000, and in an additional example, from about 100,000 to about 1,000,000 or from about 150,000 to about 2,000,000.

In another embodiment, fluoroelastomers can be used as the support polymer. For example, fluoroelastomers can have a monomeric repeat unit including, but not limited to, tetrafluoroethylene, perfluoro(methyl vinyl ether), perfluoro (propyl vinyl ether), perfluoro(ethyl vinyl ether), vinylidene fluoride, hexafluoropropylene, and mixtures thereof. The fluoroelastomers can further include a cure site monomer (a curing agent).

In embodiments, in addition to fluoro-polymers, the support polymer can also include various other inorganic filler materials as known to one of ordinary skill in the art for fixing members to form the surface layer on the fixing member substrate.

FIGS. 1A-1C and 2A-2B depict a portion of various exemplary fixing members 100A-100C and 200A-200B in accordance with various embodiments of the present teachings. It should be readily apparent to one of ordinary skill in the art that each fixing member depicted in the figures represents a generalized schematic illustration and that other components/layers/particles can be added or existing components/layers/particles can be removed or modified.

In one embodiment as shown in FIG. 1A, the member 100A can include a substrate 110 and a surface layer disposed over the substrate 110. The surface layer of FIG. 1A can include a support polymer 130 having one or more surface structural features 135 and a fluoro-polymer 22 dispersed on the surface structural features 135.

Note that although the fluoro-polymer 22 is shown in a form of particles in FIGS. 1-2, any other suitable forms including, but not limited to, rods, tubes, flakes, or coating layers, can be used in accordance with various embodiments of the present teachings.

Figure 1B:
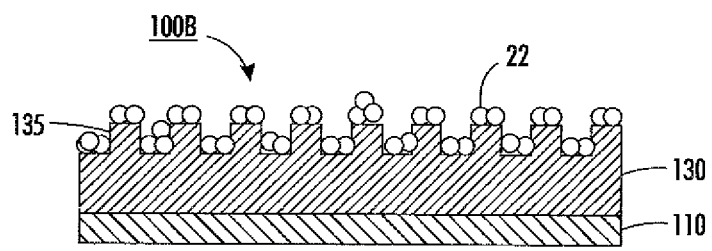

In one embodiment as shown in FIG. 1B, the member 100B can include similar structures as shown in FIG. 1A except that the fluoro-polymer 22, for example, fluoro-polymer particles or the fluoro-polymer coatings, can be dispersed on the entire surface (i.e., the textured surface) of the support polymer 130 including the surface of the structural features 135.

Figure 1C:
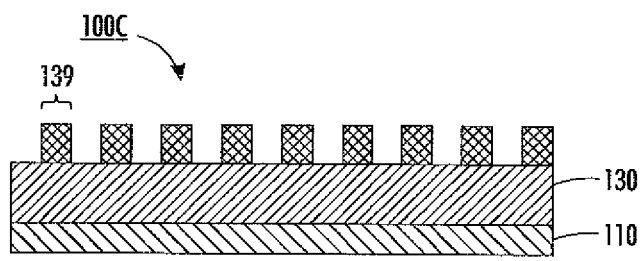

In one embodiment as shown in FIG. 1C, the member 100C can include a substrate 110 overlaid by a surface layer that is annealed from the surface layers of FIGS. 1A-1B. For example as shown in FIG. 1C, the annealed surface structural features 139 can be formed by thermally annealing the support polymer 130 and/or the fluoro-polymer 22 of FIGS. 1A-1B.

Figure 2A:
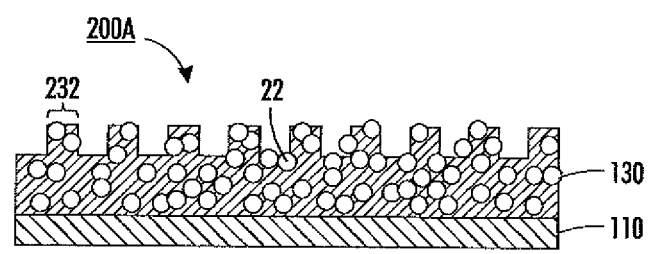
FIGS. 2A-2B depict a portion of another set of exemplary fixing members in accordance with various embodiments of the present teachings.

In one embodiment as shown in FIG. 2A, the member 200A can include a substrate 110 and a surface layer having a fluoro-polymer 22 dispersed within or embedded in the support polymer 130. The surface layer can include structural features 232 and a textured surface that includes the fluoro-polymer 22.

Figure 2B:
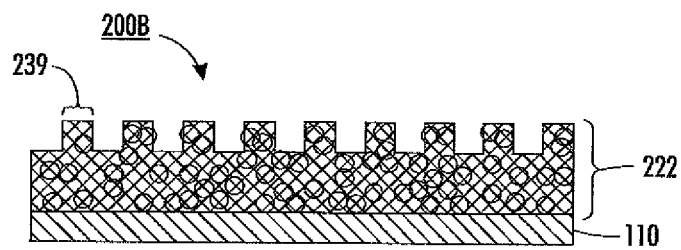

In one embodiment as shown in FIG. 2B, the member 200B can include an annealed surface layer 222 disposed over a substrate 110. The annealed polymer-based surface layer 222 can be thermally annealed from, for example, the surface layer of FIG. 2A, including fluoro-polymer 22 dispersed within the support polymer 130. The annealed polymer-based surface layer 222 can thus have one or more annealed structural features 239 to render a textured surface that contains fluoro-polymer 22.

In embodiments, the substrate 110 of FIGS. 1-2 can be a fixing member substrate including, but not limited to, a roller, a belt, a plate, a film, a sheet, a drum, or a drelt (cross between a belt and a drum). In various embodiments, the substrate 110 can be formed of a wide variety of materials, such as, for example, metals, metal alloys, rubbers, glass, ceramics, plastics, or fabrics. In an additional example, the metals used can include aluminum, anodized aluminum, steel, nickel, copper, and mixtures thereof, while the plastics used can include polyimide, polyester, polyetheretherketone (PEEK), poly (arylene ether), polyimide and mixtures thereof.

In certain embodiments, the substrate 110 of FIGS. 1-2 can be in a belt configuration having a thickness of from about 50 µm to about 400 µm, and in some cases, from about 50 µm to about 100 µm. Alternatively, the substrate 110 can be in a cylinder or a roll configuration having a thickness of from about 2 mm to about 20 mm, and in some cases, from about 3 mm to about 10 mm.

In various embodiments, one or more other functional layers can be disposed between the substrate 110 and surface layers of FIGS. 1-2. For example, the support polymer 130, 222 can be formed over an elastic layer that can be formed over the substrate 110. In another example, an interfacial layer may further be disposed between the elastic layer and the support polymer 130, 222.

In embodiments, the elastic layer disposed between the substrate and the support polymer or the surface layer can include a cured polymer including, but not limited to, a silicone elastomer, a polyperfluoroether elastomer, a fluoroelastomer or a combination thereof.

In embodiments, the textured surface of the surface layer of FIGS. 1-2 on the substrate 110 can include a nano- or micro- structured surface having various regular or irregular topographies, such as periodic and/or ordered nano-, micro-, or nano-micro- surface structural features 135, 139, 232, 239 of FIGS. 1-2. For example, the structural features can have protrusive or intrusive features having regular or irregular shapes for providing desired surface wettability.

In embodiments, the surface structural features 135, 139, 232, 239 of FIGS. 1-2 can have a cross-sectional shape of, for example, a circle, a rectangle, an oval, a square, a triangle, a polygon, and a combination thereof.

In embodiments, each of the surface structural features 135, 139, 232, 239 of FIGS. 1-2 can have a perimeter of at least about 10 nm, or at least about 100 nm, or in a range from about 100 nm to about 200 µm.

In embodiments, each of the surface structural features 135, 139, 232, 239 of FIGS. 1-2 can have a depth of at least about 10 nm, or at least about 100 nm, or in a range from about 100 nm to about 5 µm.

In embodiments, the surface structural features 135, 139, 232, 239 of FIGS. 1-2 can be periodically ordered structural features and can form arrays. The arrays of the ordered structural features can include, for example, a hexagonal array, a tetragonal array, a quasi-crystal array, a linear array, or a combination thereof.

In embodiments, the plurality of periodically ordered structural features can have a center-to-center spacing of at least about 100 nm including a range from about 100 nm to about 500 µm, or greater than about 500 µm.

In this manner, as shown in FIGS. 1-2, the disclosed fixing member can have desired surface properties including, for example, an increased hydrophobicity/oleophobicity and/or a reduced surface energy.

For example, the textured surface of FIGS. 1-2 that includes fluoro-polymer can have a water contact angle of at least about 90° or at least about 120°. In embodiments, the textured surface of the fixing members in FIGS. 1-2 can be super-hydrophobic having a water contact angle of at least about 150°. In an exemplary embodiment, the textured surface of the fixing members in FIGS. 1-2 can have a roughness scale similar to that of a lotus leaf, which is super-hydrophobic and has a water contact angle of about 170° or higher.

In other embodiments, the textured surface of the fixing members in FIGS. 1-2 can be oleophobic, e.g., having a hexadecane (or hydrocarbons, silicone oils, etc.) contact angle of about 60° or greater, or about 90° or greater, or about 120° or greater.

In embodiments, the textured surface of the fixing members in FIGS. 1-2 can have a low surface energy of, for example, about 50 mN/m or less, or about 30 mN/m or less, or about 20 mN/m or less such as ranging from about 5 mN/m to about 20 mN/m.

In certain embodiments, the fixing members in FIGS. 1-2 can be used as, for example, a fusing roller or a fusing belt, for an oil-less operation in the electrophotographic printing process.

Figure 3:
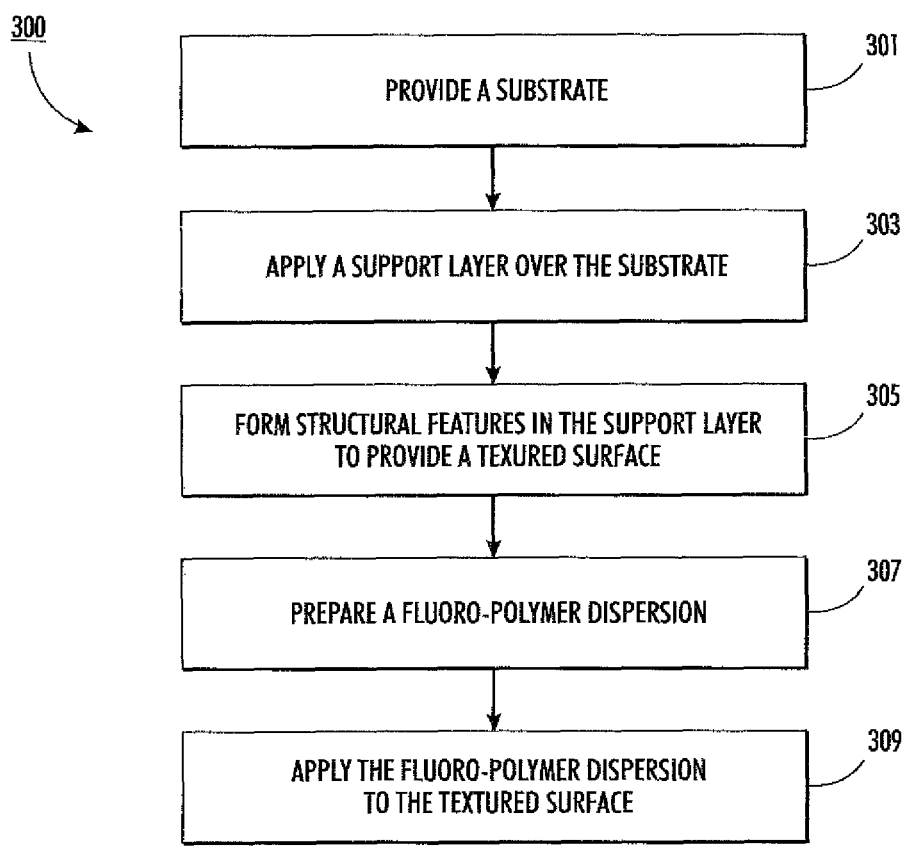
FIG. 3 depicts an exemplary method for making a fixing member in accordance with various embodiments of the present teachings.

FIG. 3 depicts a method 300 for making a fixing member in accordance with various embodiments of the present teachings. Note that although the method 300 will be described in connection with FIGS. 1A-1C for illustrative purposes, the process of method 300 is not limited to the structures shown in FIGS. 1A-1C.

In addition, while the method 300 of FIG. 3 is illustrated and described below as a series of acts or events, it will be appreciated that the present teachings are not limited by the illustrated ordering of such acts or events. For example, some acts may occur in different orders and/or concurrently with other acts or events apart from those illustrated and/or described herein. Also, not all illustrated steps may be required to implement a methodology in accordance with one or more aspects or embodiments of the present invention. Further, one or more of the acts depicted herein may be carried out in one or more separate acts and/or phases.

At 301 of FIG. 3, a fixing member substrate, for example, the substrate 110 as described in FIGS. 1-2, can be selected and provided for making the disclosed fixing member.

At 303 of FIG. 3, a support polymer 130 as disclosed herein can be applied to the substrate 110. The support polymer can have a smooth surface at this stage.

In an exemplary embodiment, the support polymer can be a polyimide-based layer formed from a "liquid polyimide" or a polyamic acid solution as known to one of ordinary skill in the art. In one embodiment, the polyimide-based layer can be formed by coating a solution including, for example, a polyamic acid solution, and optionally thermally-conductive species in an organic polar solvent, such as N-methyl-2-pyrrolidone (NMP). Various coating or printing techniques known in the art including, but not limited to, spin coating, blade coating, rod coating, dip coating, spray coating, and the like can be used.

At 305 of FIG. 3, one or more surface structural features 135 can be formed into the support layer 130 as shown in FIGS. 1A-1C by, for example, an patterning process or other suitable techniques. In embodiments, the surface structural features 135 can be periodically ordered structural features that form a variety of structural arrays. In embodiments, the patterning process can include, for example, imprinting, embossing, molding, micro-contact printing, micro-machining, photolithography, e-beam lithography, soft lithography or other techniques. Specifically, the molding technique can include, for example, replica molding, microtransfer molding, micromolding in capillaries, and/or solvent-assisted micromolding. The molding technique can also include, for example, a melt-extrusion or injection mold process used in plastic industry.

In embodiments, the surface structural features 135 can be formed by patterning the support polymer 130 using, for example, photolithography including a patterning process and an etching process. The etching process can include, for example, a wet etching, an oxygen etching or a plasma etching.

In an exemplary imprinting process, a stamp can be used to imprint the support polymer 130 to form the structural features 135. In embodiments, the stamp can have corresponding structural features contoured to the structural features 135 to be formed in the support polymer 130. In an exemplary process, the stamp with structural features can be used as a mold and can be pressed into the support polymer 130 to form the structural features 135.

At 307, a fluoro-polymer dispersion can be prepared including fluoro-polymer 22, and optionally, a perfluoro-surfactant in a solvent.

In embodiments, the fluoro-polymer 22 can be present in an amount ranging from about 10% to about 90%, or ranging from about 10% to about 80%, or ranging from about 20% to about 60% by weight of the total fluoro-polymer dispersion.

In embodiments, exemplary perfluoro-surfactant can have a formula as the following:

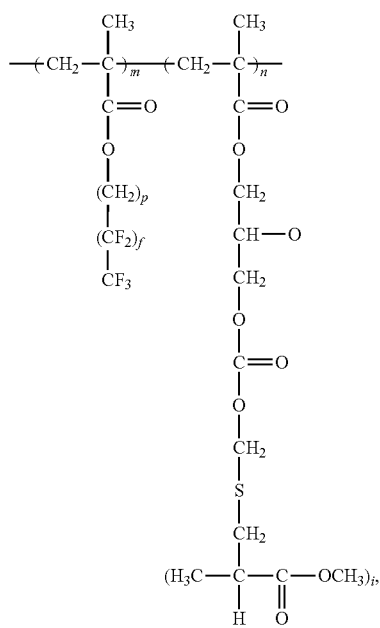

where m and n independently represent integers of from about 1 to about 300, p represents an integer of from about 1 to about 100, f represents an integer of from about 1 to about 20, and i represents an integer of from about 1 to about 500. In embodiments, other suitable perfluoro-surfactants can also be used.

The solvent can be, for example, water, hydrocarbon solvent, alcohol, ketone, chlorinated solvent, ester, ether, and the like. Suitable hydrocarbon solvents can include an aliphatic hydrocarbon having at least 5 carbon atoms to about 20 carbon atoms, such as pentane, hexane, heptane, octane, nonane, decane, undecane, dodecane, tridecane, tetradecane, pentadecane, hexadecane, heptadecane, dodecene, tetradecene, hexadecene, heptadecene, octadecene, terpinenes, isoparaffinic solvents, and their isomers; an aromatic hydrocarbon having from about 7 carbon atoms to about 18 carbon atoms, such as toluene, xylene, ethyltoluene, mesitylene, trimethylbenzene, diethyl benzene, tetrahydronaphthalene, ethylbenzene, and their isomers and mixtures. Suitable alcohol can have at least 6 carbon atoms and can be, for example, hexanol, heptanol, octanol, nonanol, decanol, undecanol, dodecanol, tetradecanol, and hexadecanol; a diol such as hexanediol, heptanediol, octanediol, nonanediol, and decanediol; an alcohol including an unsaturated double bond, such as farnesol, dedecadienol, linalool, geraniol, nerol, heptadienol, tetradecenol, hexadeceneol, phytol, oleyl alchohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, cresol, trimethyicyclohexenol; and the like.

At 309, the fluoro-polymer dispersion can be applied to the textured surface of the patterned support polymer 130 having surface structural features 135. The application of fluoro-polymer dispersion can be performed by, for example, a coating or printing process as known to one of ordinary skill in the art. Exemplary coating process can include spin coating, blade coating, rod coating, dip coating, spray coating, and the like. Exemplary printing process can include inkjet printing, flexographic printing, screen printing, micro-contact printing, and the like.

The applied fluoro-polymer dispersion can then be dried, for example, evaporated, and/or heated, to disperse fluoro-polymer particles 22 on the surface structural features 135 of the support polymer 130 (see FIG. 1A) or on the entire textured surface of the support polymer 130 (see FIG. 1B).

Optionally, the formed fixing member as shown in FIGS. 1A-1B, can be thermally annealed to form the fixing member 100C as shown in FIG. 1C. In embodiments, the annealing can be performed at a temperature of at least about 100° C., for example, ranging from about 150° C. to about 400° C., or greater than 400° C.

Figure 4A:
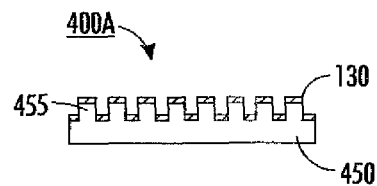
FIGS. 4A-4C depict another exemplary method for making the disclosed fixing member in accordance with various embodiments of the present teachings.
Figure 4B:
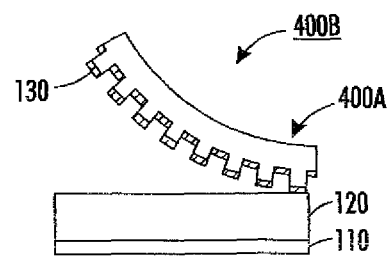
Figure 4C:
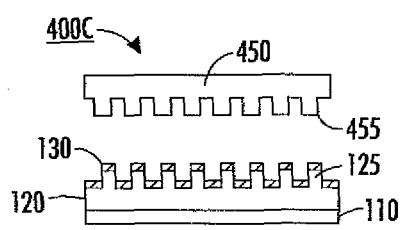

FIGS. 4A-4C depict another exemplary method for making the disclosed fixing member of FIGS. 1A-1B in accordance with various embodiments of the present teachings. Note that although the method depicted in FIG. 4 will be described in connection with FIGS. 1A-1B for illustrative purposes, the process of FIG. 4 is not limited to the structures shown in FIGS. 1A-1B.

As shown in FIG. 4A, a stamp 450 can be provide for use. The stamp 450 can include any material that can provide suitable surface structural features 455. In embodiments, the stamp 450 can be made of a rigid or flexible material including, for example, polysiloxane such as polydimethylsiloxane (PDMS), polyurethane, polyester, fluoro-silicone, or a mixture thereof. The structural features 455 of the stamp 450 can be contoured to form the structural features 135 in the final support polymer 130 as shown in FIGS. 1A-1B.

Corresponding to the structural features 135 to be formed, the structural features 455 of the stamp 450 can include one or more protrusive or intrusive features having a cross-sectional shape selected from the group consisting of a square, rectangular, circle, triangle, and/or star. Also, the stamp structural features 455 can include periodical ordered structures or periodical-hierarchical structures.

Still in FIG. 4A, a fluoro-polymer dispersion 140 can be applied to the stamp 450 having surface structural features 455. The preparation and application processes of the fluoro-polymer dispersion can be similar to that described in steps 307 and 309 of FIG. 3. For example, a fluoro-polymer dispersion including fluoro-polymer particles can be applied (e.g., coated, printed or imprinted) onto the surface structural features 455 or the entire surface of the stamp 450.

In FIG. 4B, the support polymer 130 with a smooth surface can be provided or formed over the substrate 110 and be ready for a patterning or an imprinting process by the exemplary stamp shown in FIG. 4A.

In FIG. 4C, the support polymer 130 with a smooth surface can then be patterned, for example, imprinted using the structure 400A having fluoro-polymer dispersed on the stamp 450, such that the surface structures of the stamp 450 can be replicated or molded into the support polymer 130 to form structural features 135. Meanwhile, the fluoro-polymer can be transferred onto the surface of the structural features 135 of the support polymer 130 (see FIG. 1A) or the entire textured surface of the support polymer 130 (see FIG. 1B). In embodiments, after the transfer, the fluoro-polymer 140 can be dried. Fixing members 100A, 100B can then be formed.

In embodiments, the fixing member 100C of FIG. 1C can be formed by thermally annealing the fluoro-polymer with the structural features 135 or with the entire surface of the support polymer 130 to at least form one or more annealed surface structural features 139. The annealing process of the support polymer 130 can be performed at a temperature of at least about 100° C., for example, ranging from about 150° C. to about 400° C., or greater than 400° C.

Figure 5:
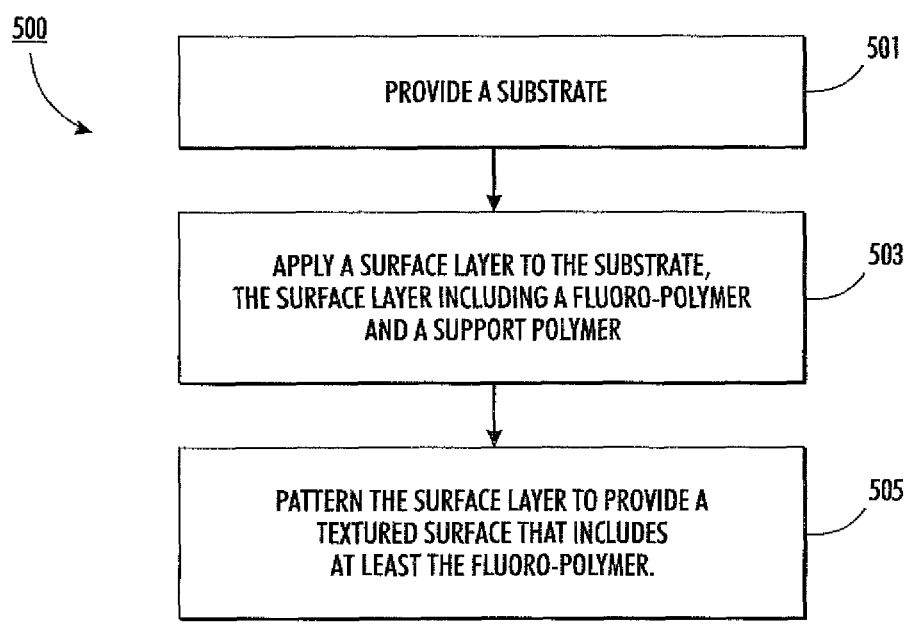
FIG. 5 depicts an additional exemplary method for making a fixing member in accordance with various embodiments of the present teachings.

FIG. 5 depicts another exemplary method for forming various fixing members in accordance with various embodiments of the present teachings. Note that although the method 500 will be described in connection with FIGS. 1-2 for illustrative purposes, the process of method 500 is not limited to the structures shown in FIGS. 1-2.

At 501 of FIG. 5, a substrate, for example, the substrate 110 of FIGS. 1-2 can be provided, as disclosed.

At 503, a surface layer can be applied to the substrate. In embodiments, the surface layer can include a support polymer 130 and a fluoro-polymer 22, 140 as shown in FIGS. 1-4.

In one embodiment, the surface layer that includes the support polymer and the fluoro-polymer can be applied having the fluoro-polymer dispersed within or embedded in the support polymer as shown in FIGS. 2A-2B.

For example, the surface layer can be formed by first preparing a fluoro-polymer dispersion as similarly described at 307 of FIG. 3. The fluoro-polymer dispersion can then be mixed with a support polymer to form a coating composition. In embodiments, the support polymer can be an elastomeric polymer including a VITON® fluoroelastomer with a corresponding cure site monomer for cross-linking the fluoroelastomer.

The coating composition can then be applied to the substrate 110 to form the surface layer with surface structural features 232 as shown in FIG. 2A. In embodiments, the coating composition can be applied to the substrate 110 using any known coating, printing, or imprinting techniques in the art.

In another embodiment, the surface layer that includes the support polymer and the fluoro-polymer can be applied with the fluoro-polymer at least partially covering the support polymer as shown in FIGS. 1A-1C.

For example, the support polymer can first be applied to the substrate. The fluoro-polymer can then be applied to the support polymer from a fluoro-polymer dispersion including the fluoro-polymer and/or the perfluoro-surfactant as disclosed herein. In embodiments, a continuous coating of the fluoro-polymer can be formed on the support polymer.

At 503, the applied surface layer, for example, the coating composition containing the support polymer and the fluoro-polymer (see FIGS. 2A-2B) and/or the fluoro-polymer on the support polymer (see FIGS. 1A-1C), can then be patterned by, for example, an imprinting process, a molding process or an etching process as similarly described at 305 of FIG. 3. In embodiments, the patterning process can be preformed after the application of the coating composition but prior to a drying process (e.g., by evaporation, and/or heat) of the applied coating composition, or after the drying process of the applied coating composition.

Following the patterning process, the patterned surface layer can then be optionally annealed at a temperature of at least about 100° C., for example, ranging from about 150° C. to about 400° C., or greater than 400° C. to form the fixing member of FIG. 1C and FIG. 2B. In this manner, the textured surface of the surface layer on the substrate, as shown in FIGS. 1-2, can include at least the fluoro-polymer.

The following examples are illustrative of various embodiments and their advantageous properties, and are not to be taken as limiting the disclosure or claims in any way.

EXAMPLE

Example 1

Preparation of PTFE/Polyimide-Based Material Having Binary Phase Surface Morphology Polyimide material was spin-coated on silicon or glass substrate at 4000 rpm for 30 seconds to make a polyimide layer with a smooth surface.

5 wt % of PTFE particles having a diameter of about 1 µm were suspended in a solvent of alcohol with perfluoro-surfactant (GF-400, 0.5 wt %). The dispersed solution was spin-coated on structured PDMS stamp. Subsequent to the uniform deposition of PTFE on top of the flexible PDMS stamp, a micro/nano-imprinting process was performed to widely disperse PTFE particles on top of polyimide surface. As observed, the non-destructive imprinting process was able to make micro/nano features and transfer PTFE particles. In some experiments, adhesion between PTFE-stamp and PTFE-target substrate was also controlled to transfer PTFE particles onto the imprinted polyimide surface.

Example 2

PFA/Polyimide-Based Material

A micro/nano-imprinting process was performed to widely disperse PFA particles on top of polyimide surface as similarly described in Example 1. The imprinted and PFA transferred polyimide samples were than thermally annealed at a temperature of about 350° C.

A micro/nano-imprinting process was performed to widely transfer PFA fibers (i.e., Teflon fibers) on top of the imprinted polyimide surface as similarly described in Example 1. In some experiments, the Teflon fibers can be spatially aligned in a certain direction. The imprinted and PFA transferred polyimide samples were than thermally annealed at a temperature of about 350° C.

Figure 6:
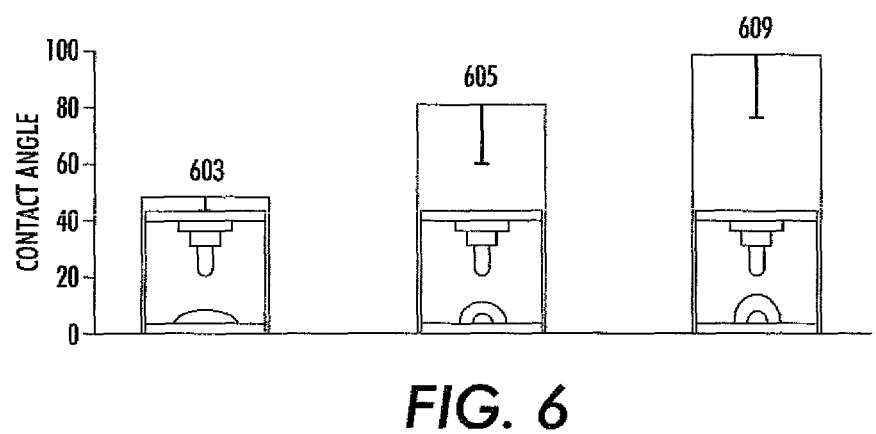
FIG. 6 depicts exemplary surface contact angle measurements in accordance with various embodiments of the present teachings.

FIG. 6 schematically depicts a contact angle comparison between exemplary surfaces having a smooth polyimide surface 603, a textured imprinted polyimide surface 605 and a textured surface 609 having continuous Teflon fibers dispersed on the imprinted polyimide 605. The contact angle measurements were performed with deionized water and averaged from several measurements.

As shown, the textured surface 609 having Teflon fibers dispersed on the imprinted polyimide surface 605 can have a contact angle of about 115°, which is greater than the imprinted polyimide surface 605 having a contact angle of about 94°. The imprinted polyimide surface 605 can in turn have a greater contact angle than the smooth polyimide surface 603, which has a contact angle of about 67°. The greater the water contact angle, the more hydrophobic of the surface, and the lower surface energy. The low surface energy, combined with high mechanical robustness, readily available materials, versatile imprinting and stamping methodology, offers many advantages for fixing applications.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method for making a fixing member comprising:
   providing a substrate;
   applying a surface layer to the substrate, wherein applying the surface layer to the substrate comprises: (i) applying a support polymer to the substrate; and (ii) coating a fluoro-polymer onto the support polymer, wherein fluoro-polymer is incorporated only on a surface of the support polymer, wherein the fluoro-polymer is in a form selected from the group consisting of a shaft, a pillar, a wire, a rod, a needle, a fiber, a thread, a flake and a combination thereof, and further wherein the support polymer is selected from the group consisting of polyimide, polycarbonate and polyketone, wherein the fluoro-polymer is in an amount of about 0.5% to about 50% by weight of the support polymer, and wherein the fluoro-polymer is an elongated fluoro-polymer having an aspect ratio of at least 10; then
   patterning the surface layer by an imprinting process to form a plurality of structural features to provide a textured surface, wherein the textured surface comprises at least the fluoro-polymer; and
   thermally annealing the surface layer,
   wherein the textured surface has a water contact angle of at least about 115°, and
   wherein the structural features of the textured surface are periodically ordered, the structural features being micro-, or nano-micro- surface structural features, the textured surface further comprising the fluoro-polymer, the fluoro-polymer providing a secondary texture on an outer surface of the periodically ordered structural features thereby resulting in a binary phase surface morphology.

2. The method of claim 1 further comprising annealing the surface layer at a temperature ranging from about 150° C. to about 400° C.

3. The method of claim 1, wherein the textured surface has a water contact angle of at least about 120°.

4. The method of claim 1, wherein the textured surface has a water contact angle of at least about 150°.

5. The method of claim 1, wherein the support polymer comprises polyimide.

6. The method of claim 1, wherein fluoro-polymer is embedded in the support polymer after the imprinting process is carried out.

7. The method of claim 1, wherein the surface layer is applied so that the fluoro-polymer at least partially covering the support polymer.

8. The method of claim 7, wherein applying a surface layer to the substrate further comprises
   coating the fluoro-polymer onto the support polymer from a fluoro-polymer dispersion comprising the fluoro-polymer or a perfluoro-surfactant.

9. The method of claim 1, wherein the surface layer is applied having a continuous coating of the fluoro-polymer on the support polymer.

10. The method of claim 1, wherein the thermally annealing is carried out at a temperature ranging from about 350° C. to about 400° C.

11. A method for making a fixing member comprising:
    providing a substrate;
    applying a surface layer to the substrate, wherein applying the surface layer to the substrate comprises: (i) applying a support polymer to the substrate; and (ii) coating a fluoro-polymer onto the support polymer, wherein fluoro-polymer is incorporated only on a surface of the support polymer, wherein the fluoro-polymer is in a form selected from the group consisting of a shaft, a pillar, a wire, a rod, a needle, a fiber, a thread, a flake and a combination thereof, and further wherein the support polymer is selected from the group consisting of polyimide, polycarbonate and polyketone, and wherein the fluoro-polymer is in an amount of about 0.5% to about 50% by weight of the support polymer;
    patterning the surface layer by an imprinting process to form a plurality of structural features to provide a textured surface, wherein the textured surface comprises at least the fluoro-polymer; and thermally annealing the surface layer, wherein the textured surface has a water contact angle of at least about 115°, and wherein the structural features of the textured surface are periodically ordered, the structural features having a depth ranging from about 10 nm to about 5 microns, the textured surface further comprising the fluoro-polymer, the fluoro-polymer providing a secondary texture on an outer surface of the periodically ordered structural features thereby resulting in a binary phase surface morphology.

12. The method of claim 11, wherein the fluoro-polymer comprises one or more materials selected from the group consisting of polytetrafluoroethylene (PTFE), perfluoroalkoxy polymer resin (PFA), polyethylenetetrafluoroethylene (PETFE), copolymers of tetrafluoroethylene (TFE) and perfluoro(ethyl vinyl ether) (PEVE), copolymers of tetrafluoroethylene (TFE) and perfluoro(methyl vinyl ether) (PMVE), copolymers of hexafluoropropylene (HFP) and vinylidene fluoride (VDF or VF2), terpolymers of tetrafluoroethylene (TFE), vinylidene fluoride (VDF) and hexafluoropropylene (HFP), and tetrapolymers of TFE, VF2, and HFP.

13. The method of claim 11, wherein the textured surface has a water contact angle of at least about 120°.

14. The method of claim 11, wherein the textured surface has a water contact angle of at least about 150°.

15. The method of claim 11, wherein the fluoro-polymer is an elongated fluoro-polymer having an aspect ratio of at least 10.

16. The method of claim 11, wherein the thermally annealing is carried out at a temperature ranging from about 350° C. to about 400° C.

17. A method for making a fixing member comprising:
providing a substrate;
applying a surface layer to the substrate, wherein applying the surface layer to the substrate comprises: (i) applying a support polymer to the substrate; and (ii) coating a fluoro-polymer onto the support polymer, wherein fluoro-polymer is incorporated only on a surface of the support polymer, wherein the surface layer comprises a fluoro-polymer and a support polymer, wherein the fluoro-polymer is a fiber, and further wherein the support polymer comprises one or more materials selected from the group consisting of polyimide, polycarbonate and polyketone, and wherein the fluoro-polymer is in an amount of about 0.5% to about 50% by weight of the support polymer;

patterning the surface layer by an imprinting process to form a plurality of structural features to provide a textured surface, wherein the textured surface comprises at least the fluoro-polymer; and thermally annealing the surface layer, wherein the textured surface has a water contact angle of at least about 115°, and wherein the structural features of the textured surface are periodically ordered, the structural features being micro-, or nano-micro- surface structural features, the textured surface further comprising the fluoro-polymer, the fluoro-polymer providing a secondary texture on an outer surface of the periodically ordered structural features thereby resulting in a binary phase surface morphology.

18. The method of claim 17, wherein the fiber is a PFA fiber.

19. The method of claim 17, wherein the thermally annealing is carried out at a temperature ranging from about 350° C. to about 400° C.

* * * * *